(12) United States Patent
Lee et al.

(10) Patent No.: US 9,035,373 B2
(45) Date of Patent: May 19, 2015

(54) GATE DIELECTRIC OF SEMICONDUCTOR DEVICE

(71) Applicant: TAIWAN SEMICONDUCTOR MANUFACTURING COMPANY, LTD., Hsin-Chu (TW)

(72) Inventors: Da-Yuan Lee, Jhubei (TW); Kuang-Yuan Hsu, Fongyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/104,656

(22) Filed: Dec. 12, 2013

(65) Prior Publication Data

US 2014/0091400 A1    Apr. 3, 2014

Related U.S. Application Data

(62) Division of application No. 13/188,091, filed on Jul. 21, 2011, now Pat. No. 8,633,536.

(51) Int. Cl.
| | |
|---|---|
| *H01L 27/088* | (2006.01) |
| *H01L 21/8238* | (2006.01) |
| *H01L 29/66* | (2006.01) |
| *H01L 29/78* | (2006.01) |
| *H01L 29/51* | (2006.01) |
| *H01L 29/49* | (2006.01) |

(52) U.S. Cl.
CPC ...... *H01L 27/088* (2013.01); *H01L 21/823842* (2013.01); *H01L 21/823857* (2013.01); *H01L 29/4966* (2013.01); *H01L 29/513* (2013.01); *H01L 29/66545* (2013.01); *H01L 29/78* (2013.01); *H01L 29/511* (2013.01)

(58) Field of Classification Search
USPC .......................................... 257/324
See application file for complete search history.

(56) References Cited

U.S. PATENT DOCUMENTS

| | | |
|---|---|---|
| 5,960,289 A | 9/1999 | Tsui et al. |
| 6,110,842 A | 8/2000 | Okuno et al. |
| 6,258,673 B1 | 7/2001 | Houlihan et al. |
| 6,602,751 B2 | 8/2003 | Oohashi |
| 6,953,727 B2 | 10/2005 | Hori |
| 7,118,974 B2 | 10/2006 | Chen |
| 7,274,046 B2 | 9/2007 | Adam et al. |
| 7,902,610 B2 | 3/2011 | Tai et al. |
| 2002/0004270 A1 | 1/2002 | Moriwaki et al. |
| 2004/0140518 A1 | 7/2004 | Lee |
| 2005/0014352 A1 | 1/2005 | Torii et al. |
| 2007/0023842 A1* | 2/2007 | Jung et al. ............ 257/369 |
| 2009/0045452 A1* | 2/2009 | Lue et al. ............. 257/321 |
| 2009/0051039 A1 | 2/2009 | Kuo et al. |
| 2010/0148274 A1 | 6/2010 | Tai et al. |

(Continued)

*Primary Examiner* — Matthew W Such
*Assistant Examiner* — Lawrence Tynes, Jr.
(74) *Attorney, Agent, or Firm* — Haynes and Boone, LLP (57) ABSTRACT

A method of fabricating a semiconductor device having a different gate structure in each of a plurality of device regions is described. The method may include a replacement gate process. The method includes forming a hard mask layer on oxide layers formed on one or more regions of the substrate. A high-k gate dielectric layer is formed on each of the first, second and third device regions. The high-k gate dielectric layer may be formed directly on the hard mask layer in a first and second device regions and directly on an interfacial layer formed in a third device region. A semiconductor device including a plurality of devices (e.g., transistors) having different gate dielectrics formed on the same substrate is also described.

13 Claims, 12 Drawing Sheets

(56) References Cited

U.S. PATENT DOCUMENTS

| | | | |
|---|---|---|---|
| 2011/0159678 A1* | 6/2011 | Hsu et al. | 438/587 |
| 2011/0233636 A1* | 9/2011 | Cho et al. | 257/314 |
| 2011/0254093 A1* | 10/2011 | Wang et al. | 257/368 |
| 2011/0256682 A1 | 10/2011 | Yu et al. | |
| 2011/0266637 A1 | 11/2011 | Lee et al. | |
| 2012/0049247 A1 | 3/2012 | Lee et al. | |

* cited by examiner

GATE DIELECTRIC OF SEMICONDUCTOR DEVICE

This application is a Divisional of U.S. patent application Ser. No. 13/188,091, filed Jul. 21, 2011, which is herby incorporated by reference in its entirety.

BACKGROUND

The present disclosure relates generally to forming an integrated circuit device on a substrate and, more particularly, to forming a gate oxide layer of a semiconductor device.

Semiconductor device geometries continue to dramatically decrease in size. Today's fabrication processes are routinely producing devices having feature dimensions less than 65 nm. However, solving the problems associated with implementing new process and equipment technology while continuing to satisfy device requirements has become more challenging. For example, metal-oxide-semiconductor (MOS) transistors have typically been formed with polysilicon gate electrodes. Polysilicon has advantageous thermal resistive properties and can allow for formation of self aligned source/drain structures.

However, in order to continually meet performance requirements, has been a desire to replace the polysilicon gate electrode with a metal gate electrode. One process of implementing metal gates is terms a "gate last" or "replacement gate" methodology. In such a process, a dummy (e.g., sacrificial) polysilicon gate is initially formed, various processes associated with the semiconductor device are performed, and the dummy gate is subsequently removed and replaced with a metal gate. However, problems arise when integrating a gate last process with other fabrication processes such as the formation of multiple gate oxide configurations on the same device (e.g., chip or die) such as in system-on-a-chip (SOC) designs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
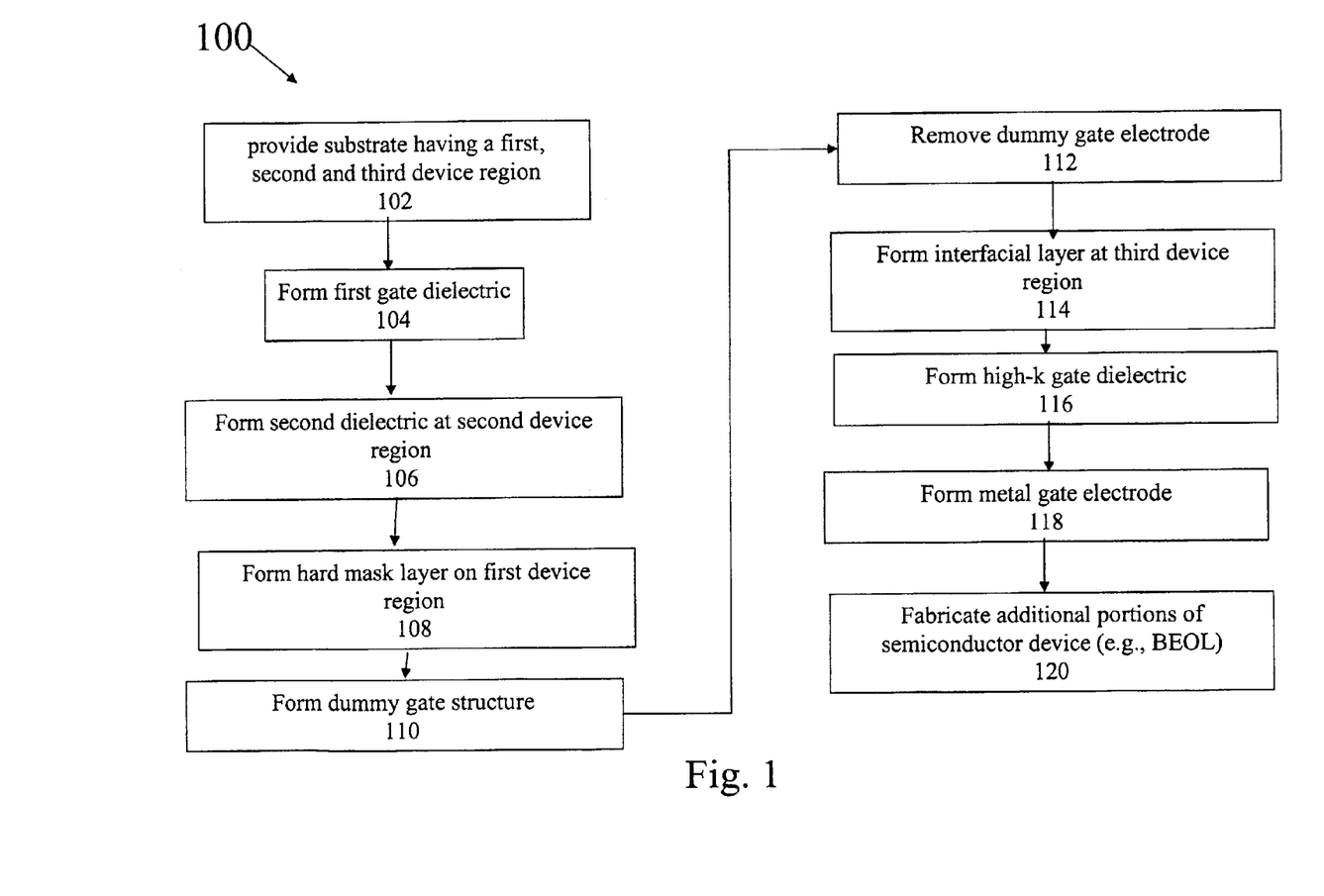
FIG. 1 is an embodiment of a method according to one or more aspects of the present disclosure.

Referring to FIG. 1, illustrated is a method 100 for fabricating a semiconductor device using a gate last methodology. FIGS. 2, 3, 4, 5, 6, 7, 8a, 8b, 9 and 10 are cross-sectional views of a semiconductor device 200 at various stages of fabrication according to an embodiment of the method of FIG. 1.

It is understood that parts of the semiconductor device 200 may be fabricated by complementary metal-oxide-semiconductor (CMOS) technology process flow, and thus some processes are only briefly described herein. Further, the semiconductor device 200 may include various other devices and features, such as other types of transistors such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected. In an embodiment, the semiconductor device 200 is a system-on-a-chip (SOC) device.

The method 100 begins at block 102 where a semiconductor substrate is provided. The semiconductor substrate includes a plurality of device regions. In an embodiment, the plurality of device regions may be associated with regions of a SOC device. In each region, different device types may be formed such as, for example, input/output (I/O) devices, high performance devices, low power devices, core devices, and/or other suitable device types. In an embodiment, a first region of the plurality of regions is an input/output region where one or more I/O devices will be formed; the second region of the plurality of regions is a lower power device area where one or more low power devices will be formed; and the third region of the plurality of regions is a core device area where one or more additional semiconductor devices (e.g., n-type or p-type field effect transistors (e.g., high performance devices)) will be formed. In an embodiment, the devices of at least two of the regions of the plurality of regions are designed to have different gate stacks. For example, the devices of two different regions may be designed to have a different configuration of gate dielectric including a different composition, different thickness, different order, etc.

The semiconductor substrate may be silicon substrate. Other exemplary substrate materials include elementary semiconductors such as germanium and diamond, compound semiconductor(s), and/or alloy semiconductor(s). The substrate may further include various doping configurations depending on design requirements. The substrate may include an epitaxial layer, may be strained for performance enhancement, and/or may include a silicon-on-insulator (SOI) structure.

Figure 2:
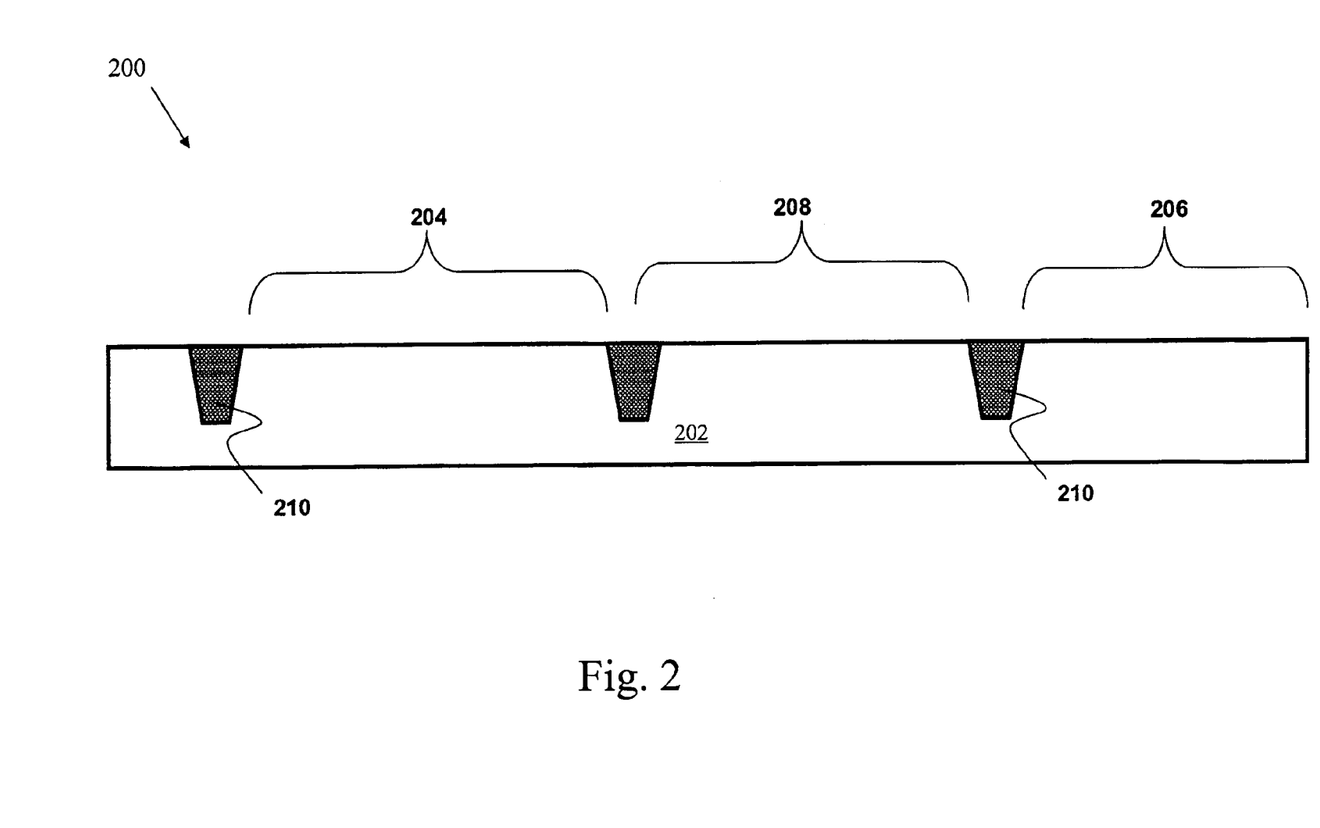
FIGS. 2-10 are cross-sectional views of a semiconductor device at various stages of fabrication according to the method of FIG. 1.

Referring to the example of FIG. 2, a semiconductor substrate 202 is provided. The substrate 202 includes silicon. The substrate 202 includes a first region 204, a second region 206, and a third region 208. In an embodiment, the first region 204 is an I/O area. In an embodiment, the second region 206 is a lower power device area. In an embodiment, the third region 208 is a core device area. The semiconductor substrate 202 includes isolation structures 210 formed on the substrate 202 for isolating the regions of the substrate. The isolation structures 210 may be formed of silicon oxide, silicon nitride, silicon oxynitride, fluoride-doped silicate glass (FSG), a low-k dielectric material, and/or other suitable insulating material. The isolation structures 210 may be shallow trench isolation (STI) features, local oxidation (e.g., LOCOS), and/or other suitable isolation structures.

The method 100 then proceeds to block 104 where a first gate dielectric is formed. The first gate dielectric may be a thermally grown oxide such as silicon dioxide (also referred to as silicon oxide). The first gate dielectric may include between approximately 15 Angstroms and approximately 60 Angstroms, by way of example and not intended to be limiting.

In an embodiment, the first gate dielectric is initially grown on the first, second and third regions of the semiconductor substrate. In an embodiment, after being thermally grown on all exposed areas of the semiconductor substrate, the first gate dielectric may be removed from the second and third device region. In an embodiment, the first gate dielectric is removed from the second and third device areas using suitable photolithography and etching processes. An exemplary etching process to remove the first gate dielectric includes a dilute HF wet etch. Thus, the first gate dielectric remains disposed on the first region of the substrate (e.g., the I/O area). In alternative embodiments, the first dielectric is selectively grown only in the first region of the substrate.

In another embodiment, the first gate dielectric layer is a high-k dielectric material. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods. The first gate dielectric layer of high-k dielectric material may be formed in the first device region using suitable deposition, photolithography and/or etching processes.

Figure 3:
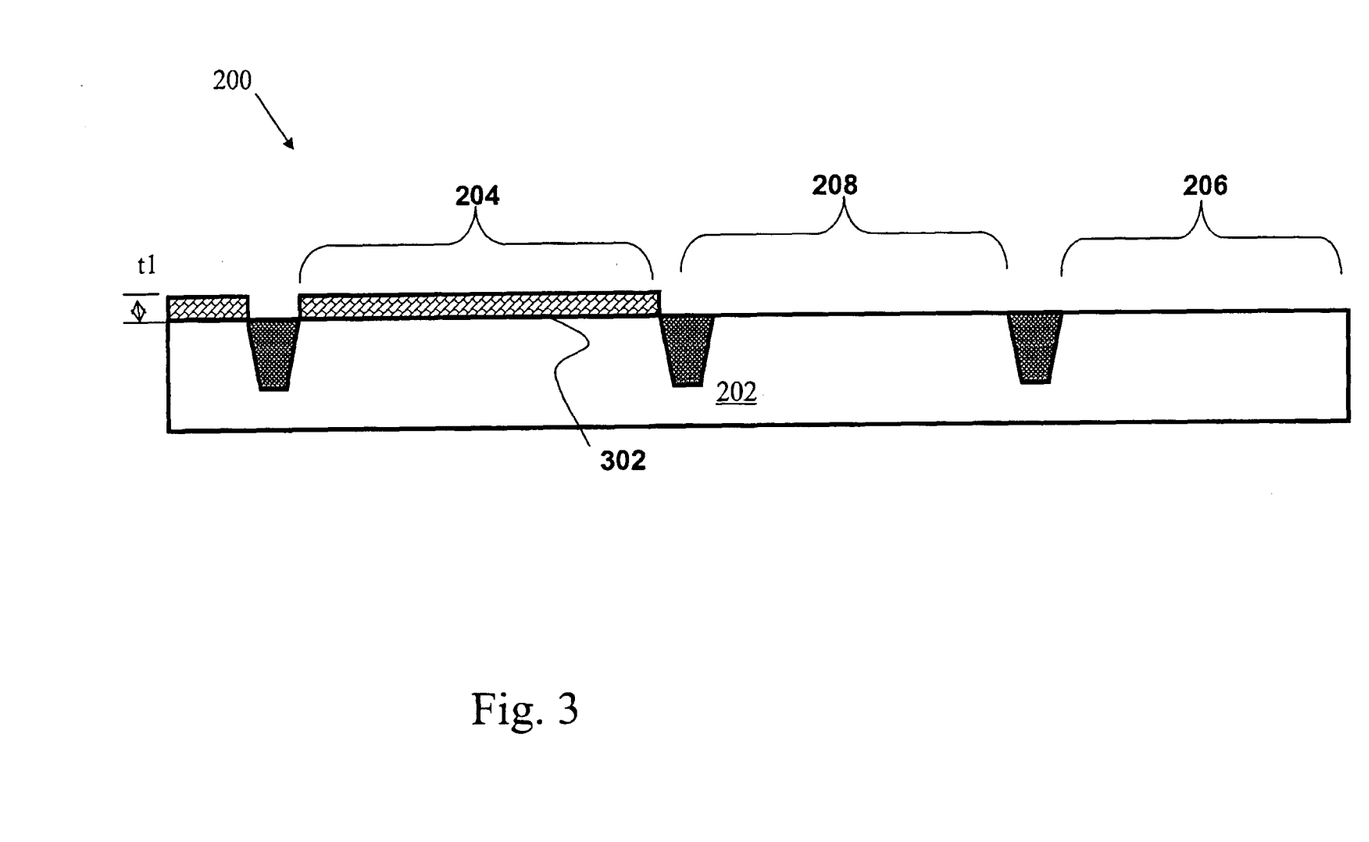

Referring to the example of FIG. 3, a first gate dielectric layer 302 is formed in the first device region 204. The first gate dielectric layer 302 may be thermally grown silicon dioxide. In an embodiment, the thickness t1 of the first gate dielectric layer 302 is between approximately 15 Angstroms and approximately 100 Angstroms. The first gate dielectric layer 302 may form a portion of the gate dielectric of a device to be formed in the first device region 204.

Having the first gate dielectric formed in the first region of the substrate, the method 100 then proceeds to block 106 where a second dielectric layer is formed on the second device region. The second dielectric layer may be an oxide layer (e.g., silicon dioxide). The second dielectric layer may be formed by thermal oxidation, chemical vapor deposition (CVD), atomic layer deposition (ALD), and/or other suitable formation methods. In an embodiment, the second dielectric layer is formed on the third device region, as well as the second device region. The second dielectric layer may be thinner than the first gate dielectric layer, described above with reference to FIG. 3. The second dielectric layer may be between approximately 10 Angstroms and approximately 30 Angstroms, by way of example and not intended to be limiting. The second dielectric layer may serve as a gate dielectric (or portion thereof) for a device in the second device region. Alternative, the second dielectric layer may serve as an interfacial layer for the device in the second device region.

Figure 4:
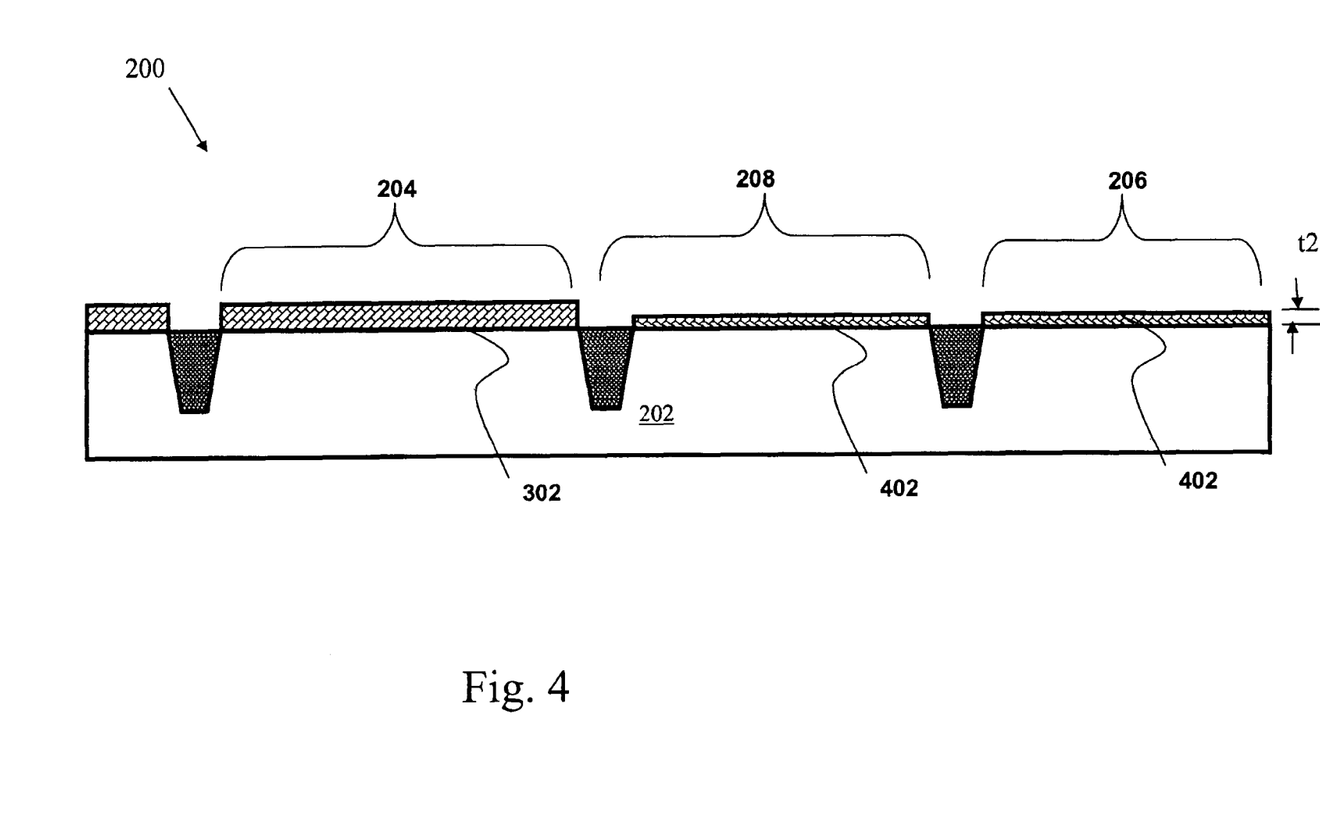

Referring to the example of FIG. 4, a second dielectric layer 402 is formed on the second device region 206 and the third device region 208. In an embodiment, the second dielectric layer 402 is omitted from the third device region 208. The thickness t2 of the second dielectric layer 402 may be between approximately 10 Angstroms and approximately 30 Angstroms. The thickness t2 may be less than the thickness t1, illustrated in FIG. 3. The second dielectric layer 402 may be formed by thermal oxidation, chemical vapor deposition (CVD), atomic layer deposition (ALD), and/or other suitable formation methods.

The method 100 then proceeds to block 108 where a hard mask layer is formed on the first device region and/or the second device region. The hard mask layer may include a nitride. In an embodiment, the hard mask layer is SiN. Other exemplary materials include metal nitride such as TiN. The hard mask layer may be deposited on the substrate using suitable deposition techniques such as CVD or PVD. The hard mask layer may be concurrently formed on the third device region and subsequently removed by suitable processes such as photolithography patterning to expose the third device (e.g., while protecting the first and second areas) and performing an etch to remove the hard mask layer from the third region. An exemplary etch includes a $H_3PO_4$ wet etch.

Figure 5:
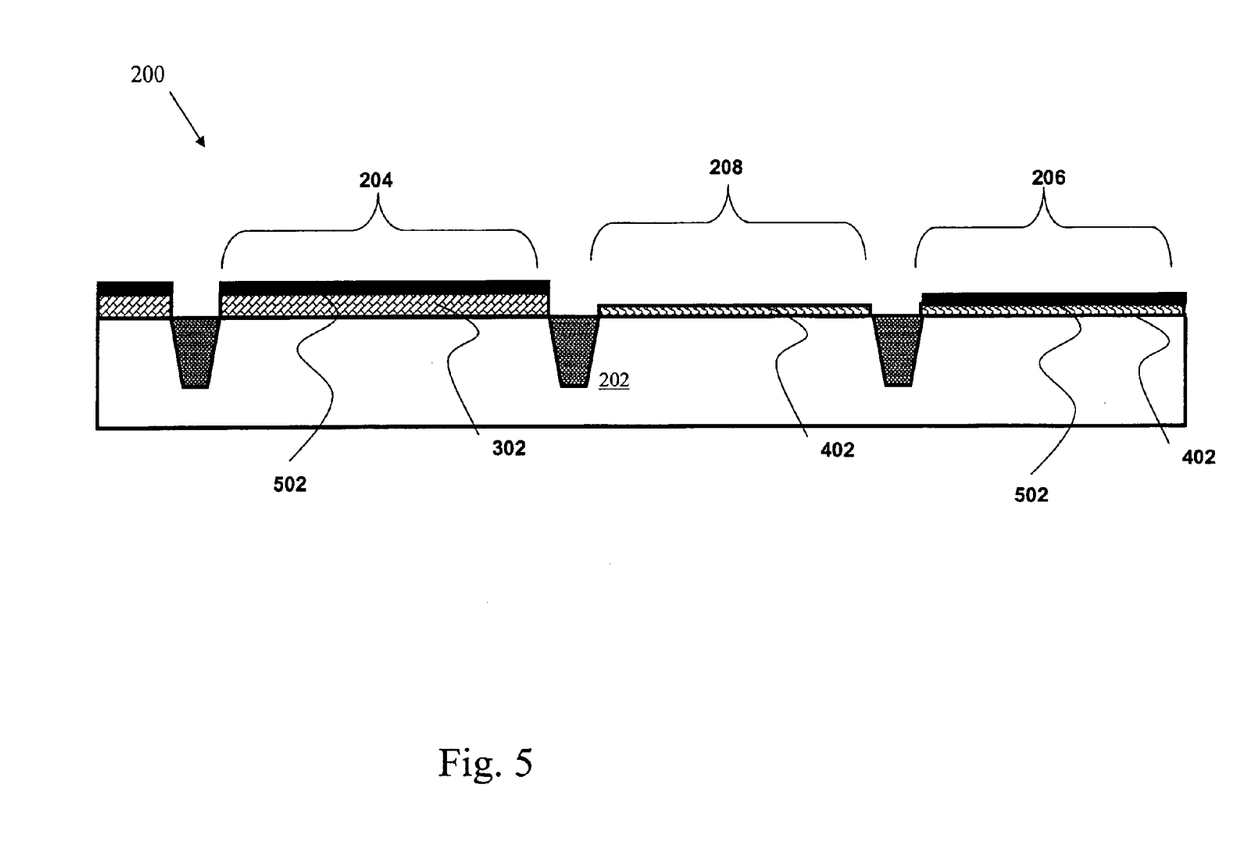

Referring to the example of FIG. 5, illustrated is a hard mask layer 502 formed on the first device area 204 and the second device area 206. In an embodiment, the hard mask layer 502 is SiN. In an alternative embodiment, the hard mask layer 502 is not formed on the second device region 206. The thickness of the hard mask layer 502 may between approximately 5 Angstroms and approximately 30 Angstroms.

Figure 6:
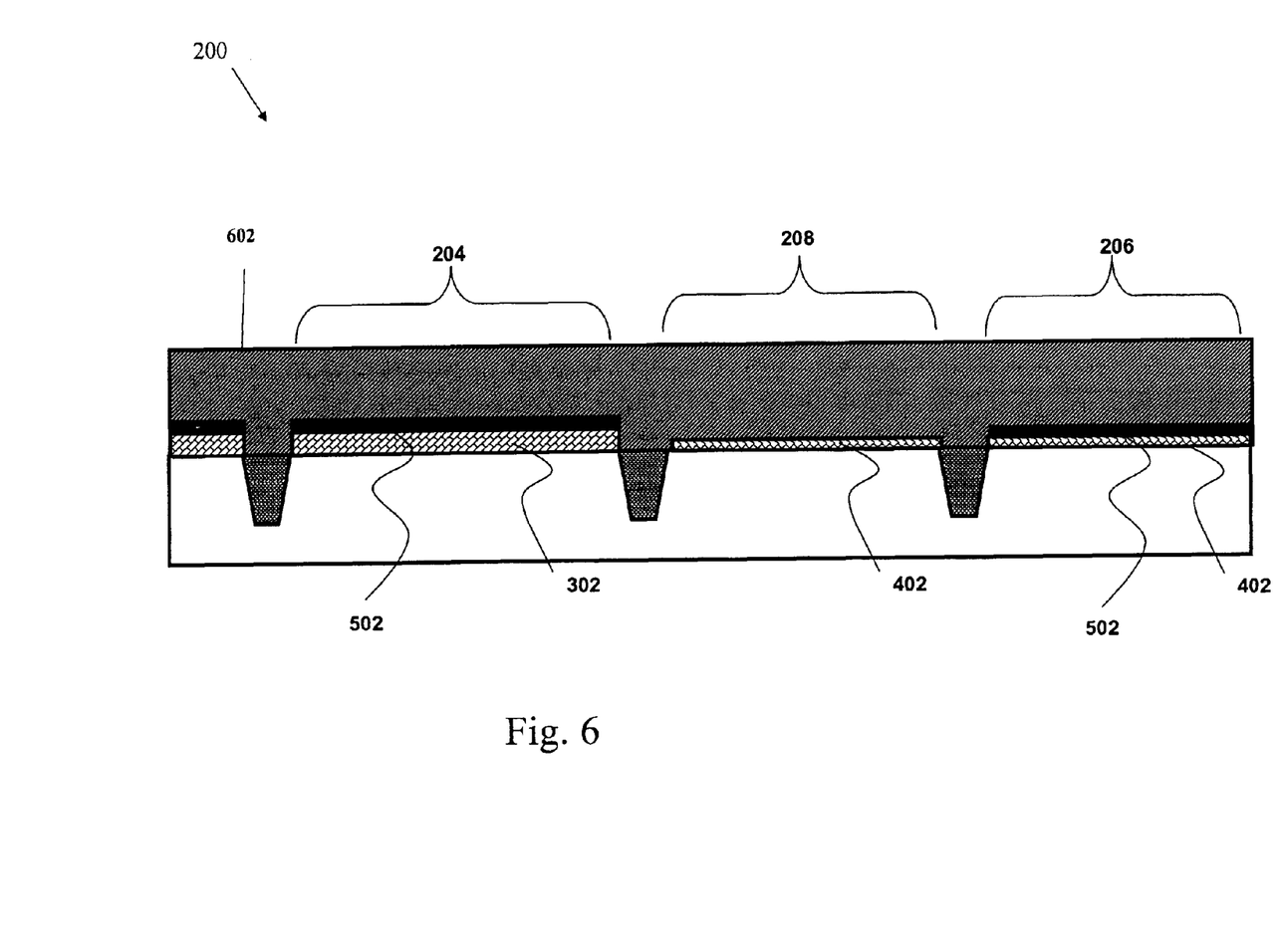
Figure 7:
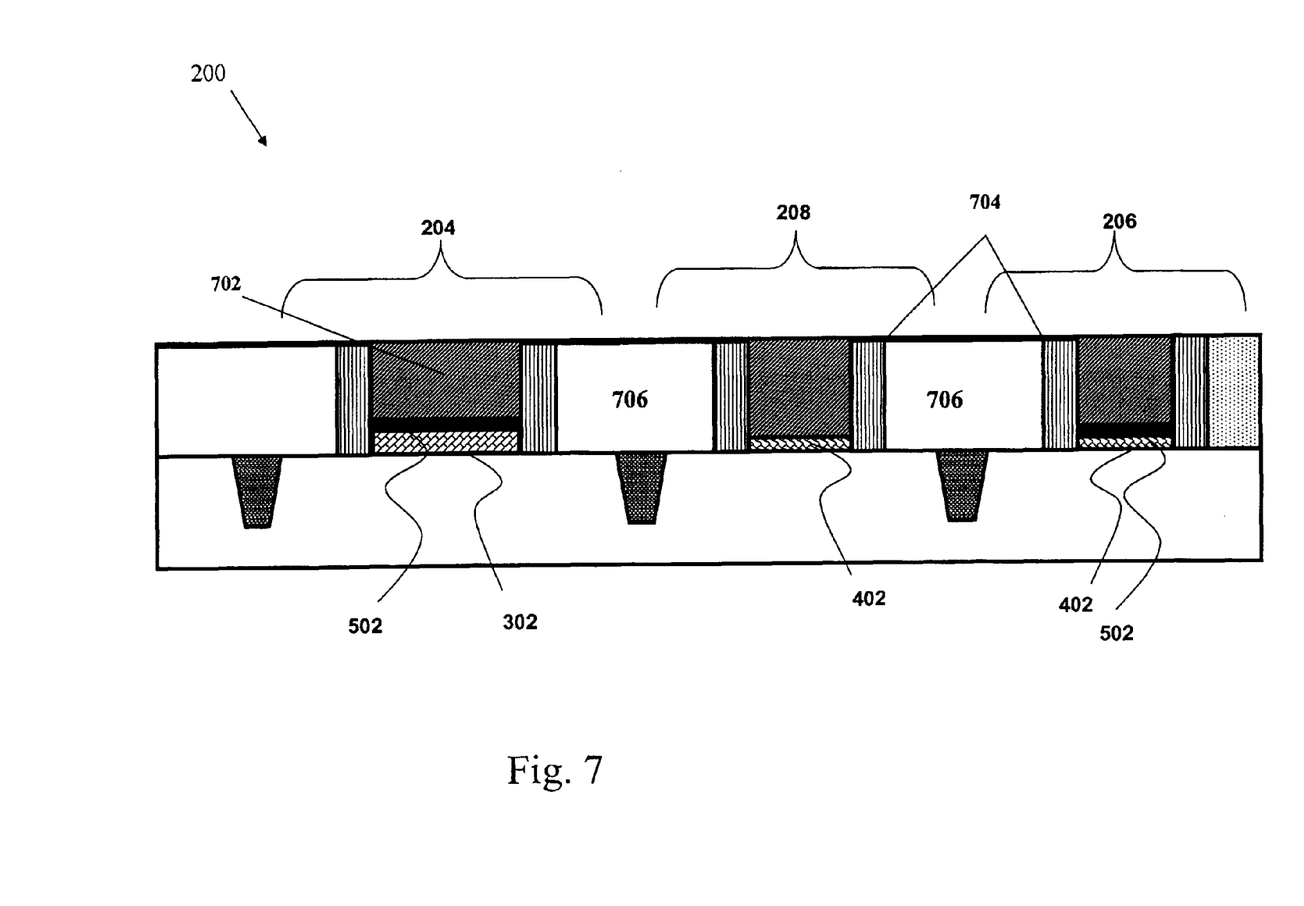

The method 100 then proceeds to block 110 where a dummy gate structure is formed. In an embodiment, a dummy gate electrode material is deposited, for example, by physical vapor deposition (PVD) or CVD. Exemplary materials for the dummy gate electrode include polysilicon and other types of silicon. Referring to the example of FIG. 6, illustrated is the semiconductor device 200 including a dummy gate material 602 formed on the substrate 202. The dummy gate material 602 may be formed by PVD and CVD across the substrate 202. In an embodiment, the dummy gate material 602 is polysilicon.

The dummy gate material may then be patterned and etched into one or more dummy gate electrodes. Referring to the example of FIG. 7, a plurality of dummy gate electrodes 702 are formed (from the dummy gate material 602, described above with reference to FIG. 6) on the substrate 202. The dummy gate electrodes 702 may be formed overlying the dielectric materials and/or hard mask layer formed above in blocks 104, 106, 108.

In further processing in block 110, spacer elements are formed on either side of the gate stack including dummy gate electrode as is known in the art. Referring to the example of FIG. 7, sidewall spacers 704 are formed adjacent the dummy gate electrodes 702. The sidewall spacers 704 may include silicon nitride, silicon oxide, silicon oxynitride, and/or other suitable dielectric materials. In embodiments, the sidewall spacers 704 include a plurality of layers, for example, liner layers.

In further processing, an inter-layer dielectric (ILD) layer is formed on semiconductor substrate interposing the dummy gate electrodes. Referring to the example of FIG. 7, an ILD layer 706 is formed on the substrate 202. The ILD layer 706 may be formed by chemical vapor deposition (CVD), high density plasma CVD (HDP-CVD), spin-on deposition, physical vapor deposition (PVD or sputtering), or other suitable methods. The ILD layer 706 may include silicon oxide, silicon oxynitride, a low-k material, and/or other suitable dielectric. The ILD layer 706 may be conformally deposited on the substrate 202 and a CMP process performed. The dummy gate electrode 702 may serve as a planarization stop for the CMP process. In other words, the CMP process may be stopped at the exposure of the top surface of the dummy gate electrode.

As in typical fabrication, source/drain regions or portions thereof may be formed adjacent the dummy gate electrode prior to the sidewall spacers and/or ILD layer being formed. Additional steps typical of a gate last or replacement gate process may be performed.

The method 100 then proceeds to block 112 where the dummy gate electrode is removed from the substrate. The dummy gate electrode may be removed by an etching solution such as, for example, $NH_4OH$, dilute-HF, and/or other suitable etchant. In an alternative embodiment, the dummy gate electrode may be removed by a suitable dry etching process. Referring to the example of FIGS. 8a and 8b, the dummy gate electrodes 702 have been removed from the substrate leaving trenches 802. It is noted that when the dummy gate electrode 702 is removed, the underlying dielectric layers (e.g., the first gate dielectric 302, the second dielectric 402) and the hard mask layer 502 remain on the substrate 202.

The method 100 then proceeds to block 114 where an interfacial dielectric layer is formed in the third device region. In an embodiment, the second dielectric layer formed in block 106 described above is removed from the third device region prior to forming the interfacial dielectric layer in the third region. Alternatively, the dielectric layer formed in block 114 may form a portion or all, of an interfacial layer for a device in the third device region, as described in further detail below. In other words, the second dielectric layer of bock 106 may remain on the substrate in the third device region.

The interfacial dielectric layer may include silicon oxide layer ($SiO_2$) or silicon oxynitride (SiON). In an embodiment, the interfacial dielectric has a thickness ranging from about 5 to about 15 angstroms. The interfacial dielectric layer may be formed by chemical oxidation, thermal oxidation, ALD, CVD, and/or other suitable dielectric.

The interfacial dielectric layer may additionally and/or alternatively, form a gate dielectric layer or portion thereof for the device(s) of the third region. In an embodiment, the interfacial dielectric layer formed in third device region (e.g., after removal of the second dielectric layer) is a high-k dielectric. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The high-k dielectric layer may be formed by atomic layer deposition (ALD) and/or other suitable methods. In an embodiment, the high-k dielectric layer is between approximately 5 Angstroms and approximately 15 Angstroms.

Figure 8A:
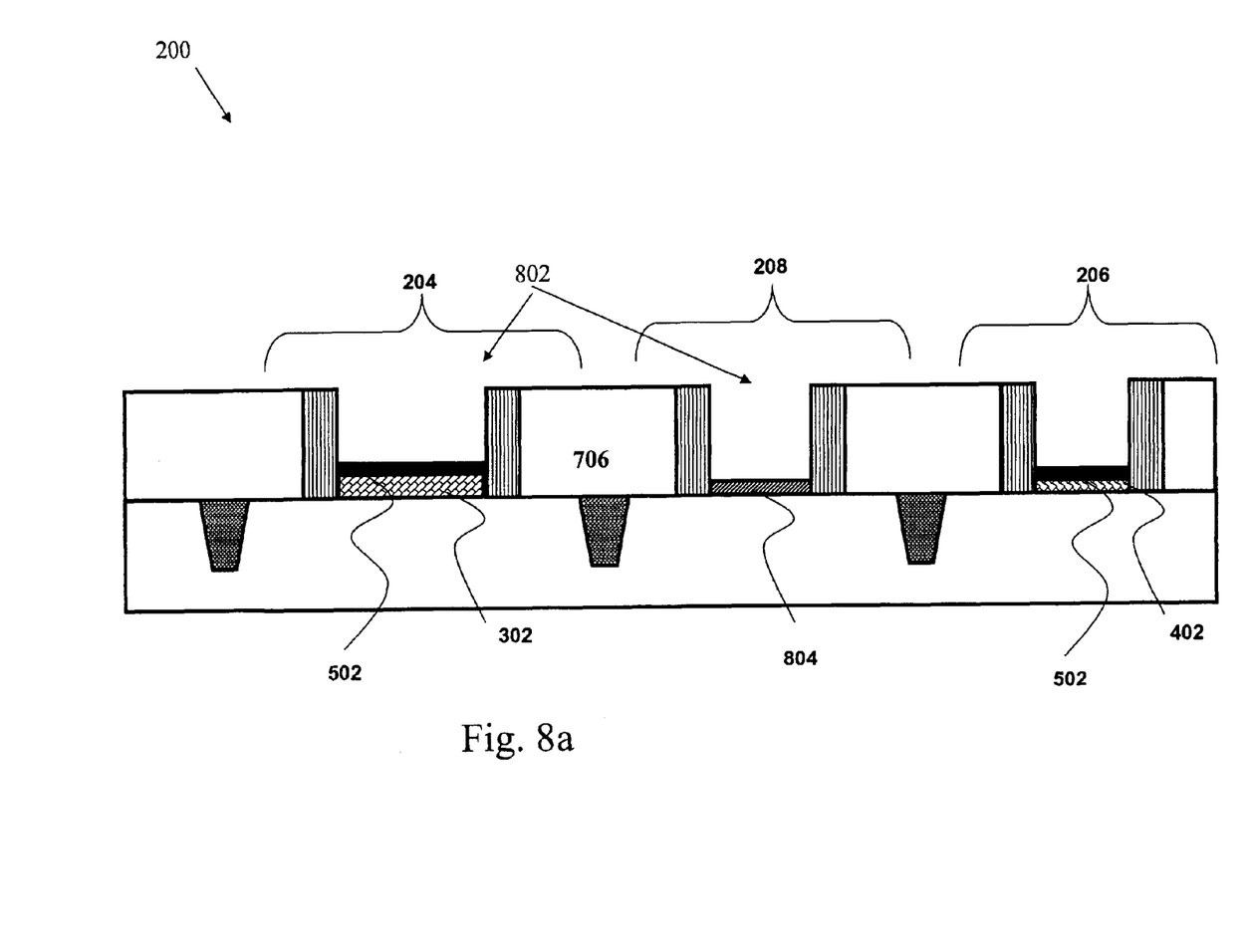

Referring to the example of FIG. 8a, the second dielectric layer 402 is removed from the third device region 208. A dielectric layer 804 is formed on the third region 208 of the substrate 202. The dielectric layer 804 is formed at the bottom of the trench 802 in the third region 208. In an embodiment, the dielectric layer 804 is a silicon oxide layer. In a further embodiment, the dielectric layer 804 may be formed by thermal oxidation. As described above, in other embodiments the dielectric layer 804 may be an oxide or high-k dielectric.

Figure 8B:
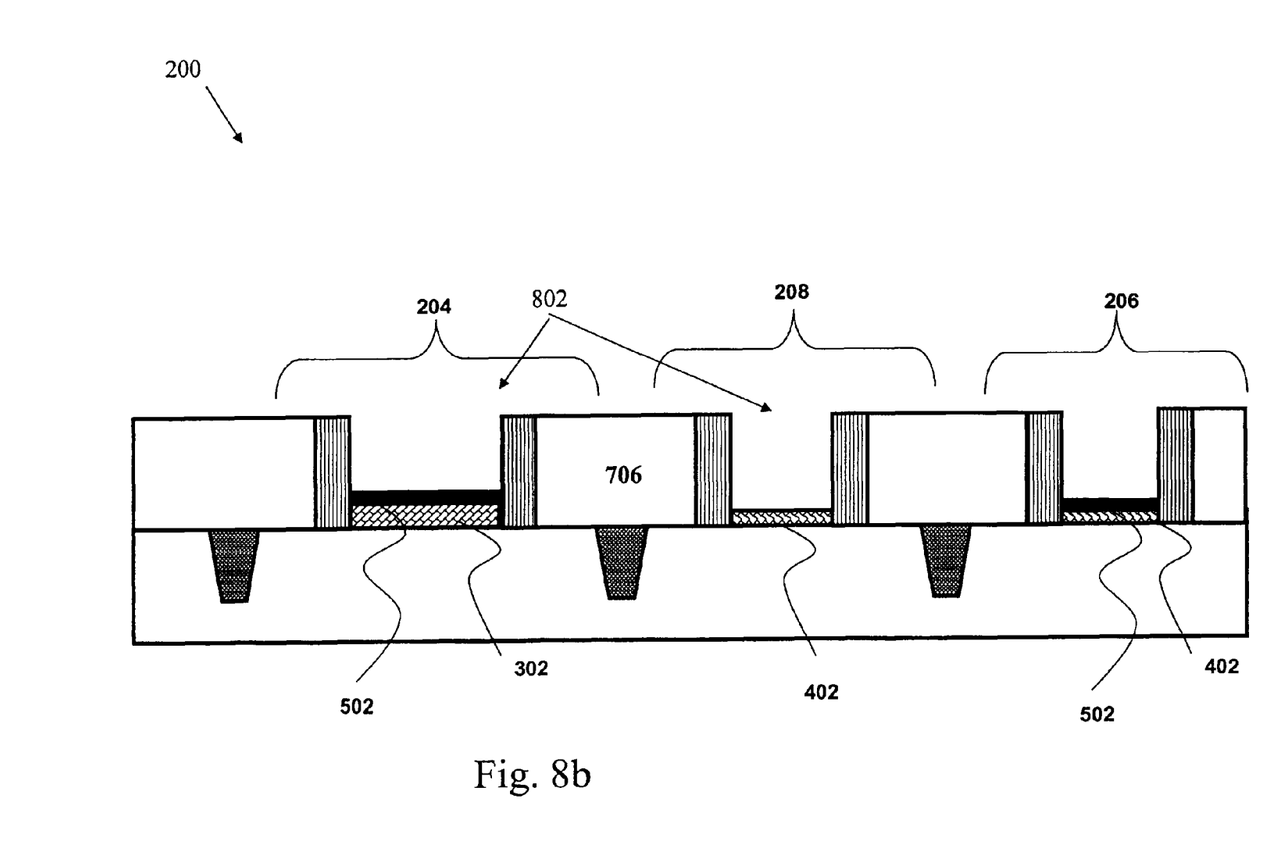

In an embodiment of the method 100, the block 114 is omitted. In such an embodiment the second dielectric layer formed in block 106 may be maintained on the third region. Referring to the example of FIG. 8b, illustrated is second dielectric layer 402 disposed in the third device region 208. The second dielectric layer 402 may be an interfacial layer for a device formed in the third device region 208.

The method 100 then proceeds to block 116 where a high-k gate dielectric layer is formed on the substrate. The high-k gate dielectric layer may be formed on each of the first, second and third regions of the substrate concurrently. The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The high-k dielectric layer may be formed by atomic layer deposition (ALD) and/or other suitable methods. The high-k dielectric layer may be between approximately 10 Angstroms and approximately 40 Angstroms in thickness. Referring to the example of FIG. 9, a high-k gate dielectric layer 902 is formed on the substrate 202.

The method 100 then proceeds to block 118 where a metal gate is formed on the substrate. Block 118 begins with a first metal gate layer being formed on the substrate. The first metal gate layer may be a work function layer. The first metal gate layer may include TiN, TaN, $ZrSi_2$, $MoSi_2$, $TaSi_2$, $NiSi_2$, WN, and/or other suitable material. The first metal gate layer may be selected based on a p-type or n-type device, respectively. The first metal gate layer may be deposited by CVD, PVD, and/or other suitable process.

Figure 9:
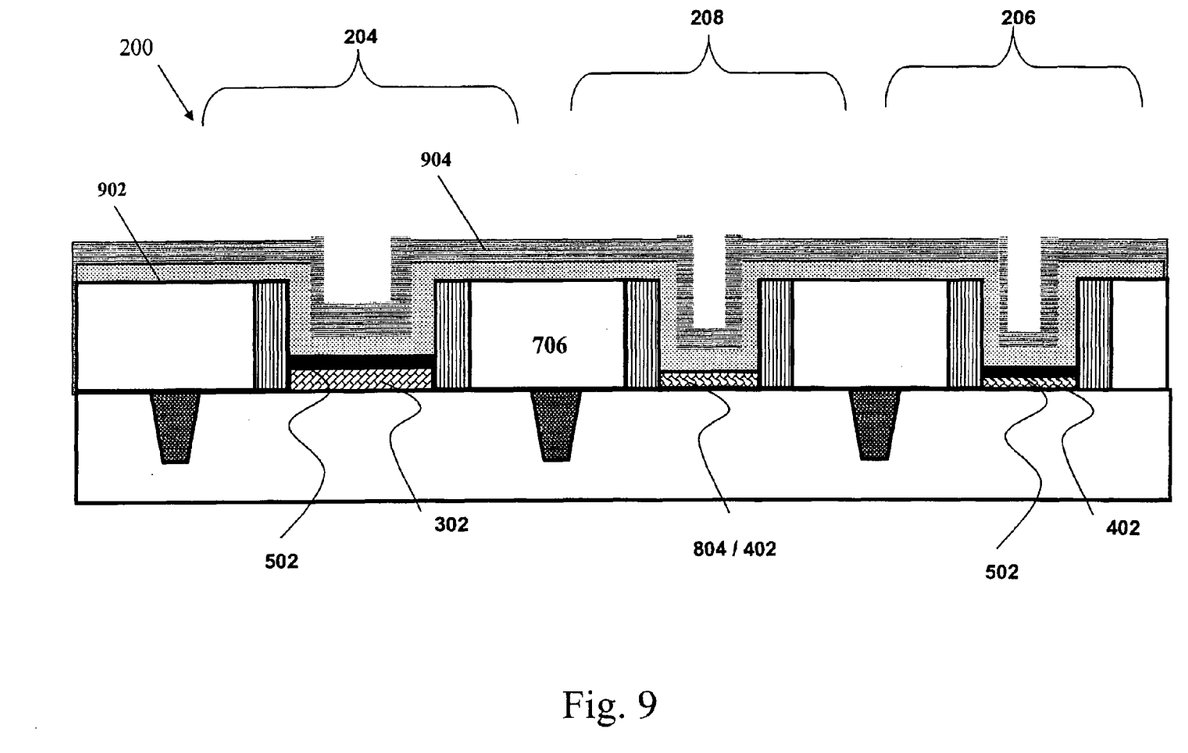

Referring again to the example of FIG. 9, a first metal gate layer is formed on the substrate—a work function layer 904. The work function layer 904 may be between approximately 10 Angstroms and approximately 100 Angstroms in thickness.

The method 100 and block 118 may continue to form additional layer(s) of the metal gate electrode including, for example, filler layers. A filler metal layer such as Al, W, or Cu may then be deposited over the work function metal layer filling in the remaining portion of the trenches formed by the removal of the dummy gate electrode. The filler metal layer may be formed by CVD, PVD, plating, or other suitable process.

After formation of one or more layers of the metal gate electrode, the method 100 in general, and block 118 in particular, may continue to perform a chemical mechanical polish (CMP) process to planarize the substrate and remove the metal-gate material(s) and/or high-k material formed on the surface of the ILD layer. Further suitable CMOS processes may be performed such as, for example, formation contacts and a multiple-layer interconnect (MLI) structure. Furthermore, additional layers may be formed in or on the metal gate electrode such as, for example, capping layers.

Figure 10:
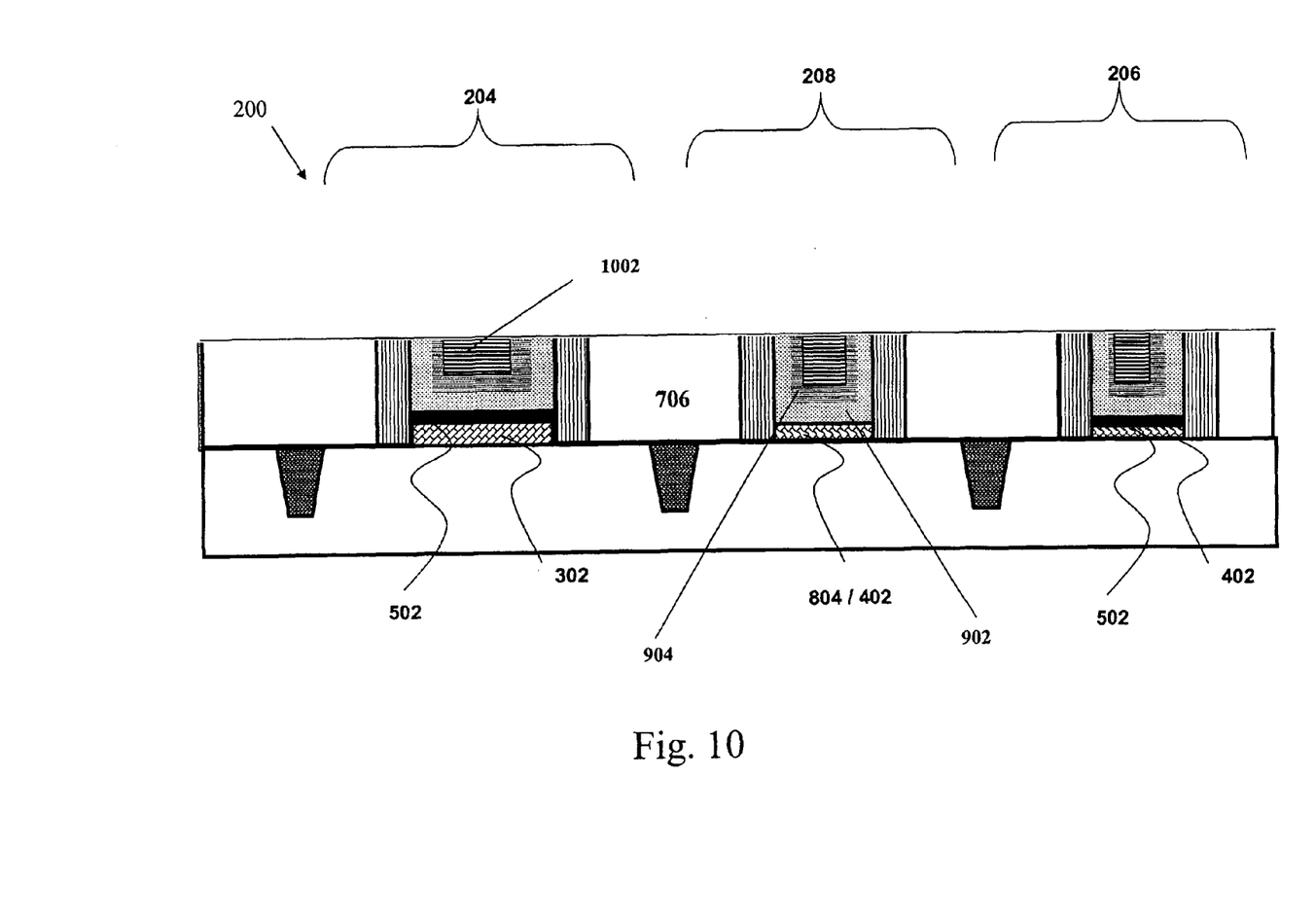

Referring to the example of FIG. 10, the semiconductor device 200 includes a filler material 1002 for the metal gate electrode. The CMP process, described above has planarized the device such that the surface of the ILD layer 706 surface is exposed. As illustrated in FIG. 10, an exemplary embodiment of the method 100 forms a semiconductor device (e.g., SOC) 100 that includes a plurality of gate structures including different configurations of gate structures. In particular, the gate structures include different configurations of interfacial layers and/or gate dielectric layers. For example, the devices in regions 204, 206, and 208 include different thicknesses of dielectric layers, different compositions of dielectric layers, different quantities of dielectric layers, etc.

The method 100 may then proceed to formation of other features of the device not discussed in detail herein, such as, for example, back-end-of-the-line (BEOL) processing and features (multi-layer interconnects), contacts, and/or other suitable features as known in the art.

Figure 11:
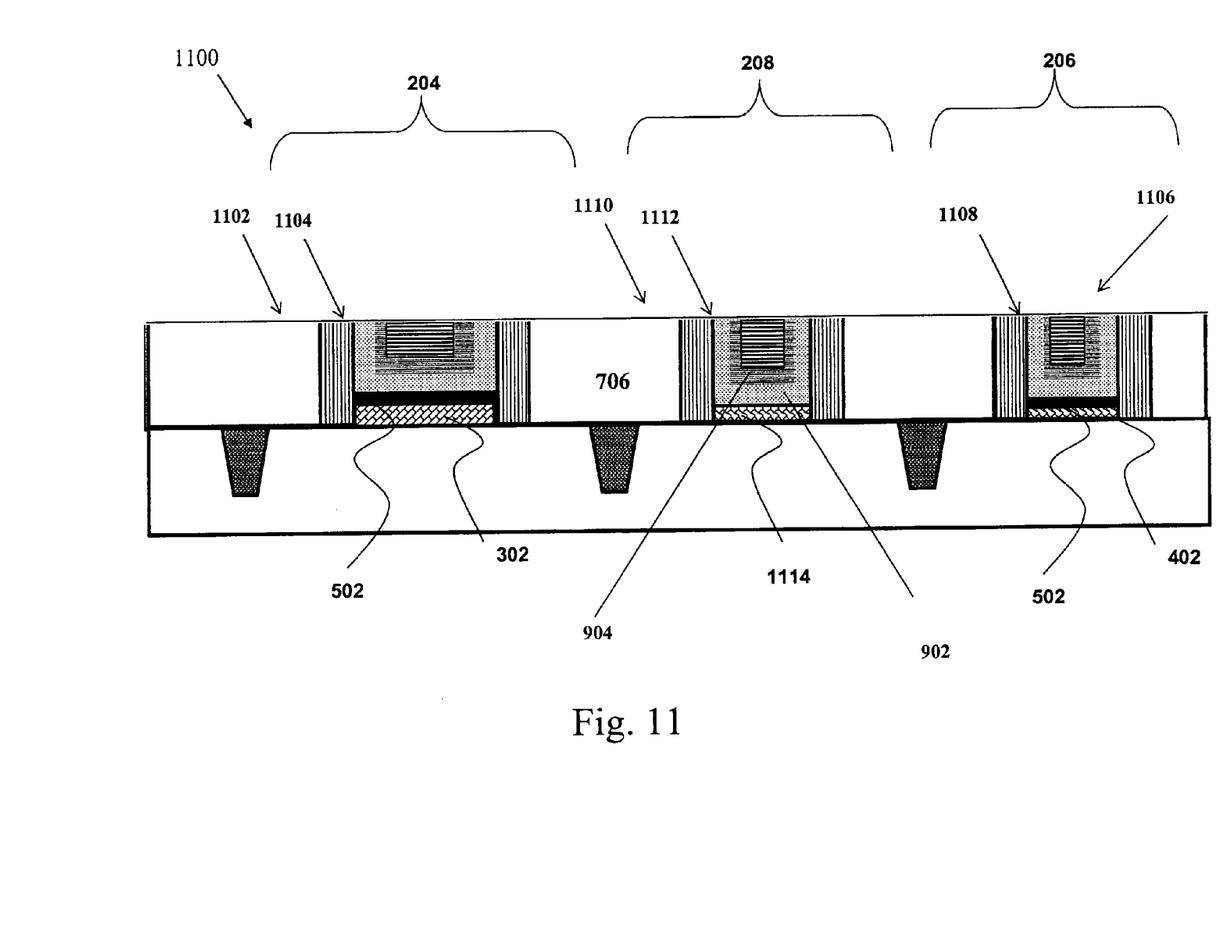
FIG. 11 is a cross-sectional view of a semiconductor device having a gate dielectric according to various aspects of the present disclosure.

Referring to FIG. 11, illustrated is a semiconductor device 1100 having gate dielectric layer(s) formed according to aspects of the present disclosure. The semiconductor device 1100 may be similar to the semiconductor device 200 of FIGS. 2-10. It is noted that, for ease of reference, element numbers are repeated from the above described of FIGS. 2-10, these elements may be substantially similar as discussed above. The device 1100 may be formed using the method 100, described above with reference to FIG. 1. However, the fabrication of semiconductor device 1100 is not limited thereto. FIG. 11 illustrates three device types formed on a single semiconductor substrate. For ease of reference, these are referred to as a device 1102 including a gate structure 1104, which is formed in a first region 204 of the substrate 202; a device 1106 including a gate structure 1108, which is formed in a second region 206 of the substrate 202; and a device 1110 including a gate structure 1112, which is formed in a third region 208 of the substrate 202. As illustrated in FIG. 11, each of the device types includes a different gate stack-up. More specifically, each of the device types includes a gate dielectric that differs in composition, thickness, quantity or configuration (e.g., stack-up).

In an embodiment, the first device 1102 is an I/O device. In an embodiment, the second device 1106 is a low-power device. In an embodiment, the third device 1110 is a core device. The devices 1102, 1106, and/or 1108 may be electrically coupled to form an SOC device 1100.

The first gate structure 1104 includes a dielectric layer 302, a hard mask layer 502, and a high-k dielectric layer 902. In an embodiment, the dielectric layer 302 is silicon dioxide. In an embodiment, the hard mask layer is SiN. The dielectric layer 302 may be thicker than the dielectric layer 1114 and/or 402.

The second gate structure 1106 may include a dielectric layer 402, a hard mask layer 502, and a high-k dielectric layer 902. In an alternative embodiment, the hard mask layer 502 may be omitted from the second gate structure 1106. In an embodiment, the hard mask layer 502 is silicon nitride. In an embodiment, the dielectric layer 402 is silicon oxide. The dielectric layer 402 maybe thermally grown silicon oxide. In an embodiment, the dielectric layer 402 provides the gate dielectric, or portion thereof, for the gate structure 1108. In an embodiment, the dielectric layer 402 provides an interfacial layer of the gate structure 1110.

The third gate structure 1110 includes an interfacial layer 1114 and a high-k dielectric layer 902. The interfacial layer 1114 may be substantially similar to the second dielectric 402, described above with reference to FIGS. 4 and 8*b*, or be substantially similar to the dielectric layer 804 described above with reference to FIG. 8*a*. In an embodiment, the interfacial layer 1114 is substantially similar to the dielectric layer 402 of the gate structure 1108. In an embodiment, the interfacial layer 1114 is silicon oxide. In an alternative embodiment, the interfacial layer 1114 is a high-k dielectric layer, which may be a different composition than the high-k dielectric layer 902.

Each of the first, second and third gate structures 1104, 1108, and 1110 respectively, further include a metal gate electrode having a work function layer 904, substantially similar to as discussed above, and a second metal layer (e.g., filler) 1002. The devices 1102, 1110 and 1106 further include source and drain regions formed adjacent to the gate structures 1104, 1112 and 1108 respectively.

The present invention achieves different advantages in various embodiments disclosed herein. For example, embodiments of the disclosed method and device provide a simple and cost-effective manner for integrating gate structures with different gate dielectric materials and stack-ups in a gate last process.

Thus, provided is a method for fabricating a semiconductor device (e.g., SOC device). The method includes providing a semiconductor substrate having a first, second and third device region. A first dielectric layer is formed in the first region. In an embodiment, the first dielectric is silicon dioxide. Thereafter, a second dielectric layer is formed in the second region. In an embodiment, the second dielectric layer may be a thinner layer of silicon dioxide. A hard mask layer is formed on the first device region on the first dielectric layer. In an embodiment, the hard mask layer is also formed on the second device region on the second dielectric layer. A high-k dielectric layer on the first, second and third device regions of the semiconductor substrate. The high-k dielectric layer is formed on the hard mask layer and the second dielectric layer.

In another embodiment described, a method of fabricating a semiconductor device is provided. The method includes forming a first oxide layer on a first device region of a semiconductor substrate and separately, forming a second oxide layer on a second device region of the semiconductor substrate. The second oxide layer differs in thickness from the first oxide layer. A hard mask layer is formed on the first oxide layer and the second oxide layer. A dummy gate electrode is formed directly on the hard mask layer in each of the first and second device regions. A source or drain is formed adjacent the dummy gate electrode in the first device region and a source or drain is formed adjacent the dummy gate electrode in the second device region. Thereafter, each of the dummy gate electrodes is removed. However, the first oxide layer and the second oxide layer remain disposed on the semiconductor substrate during the removal. An interfacial layer is also formed in a third device region of the semiconductor substrate. In an embodiment, after the dummy gate electrode is removed, an interfacial layer is formed in the third device region. In an alternative embodiment, the interfacial layer is formed at the time of the second dielectric layer (and includes the second dielectric layer). The method continues to include forming a high-k gate dielectric layer on each of the first, second and third device regions. The high-k gate dielectric layer is formed directly on the hard mask layer in the first and second device regions and directly on the interfacial layer in the third device region. A metal gate electrode is then formed on the high-k gate dielectric layer.

Further, a semiconductor device is provided. The device includes a semiconductor substrate having a first gate structure formed in a first region, a second gate structure formed in a second region, and a third gate structure formed in a third region of the substrate. Each of the first, second and third gate structures include a different stack-up (e.g., composition and/or configuration of layer). The first gate structure includes an oxide layer, a nitride layer on the oxide layer, and a high-k dielectric layer on the nitride layer. The second gate structure includes an oxide layer, a nitride layer on the oxide layer, and a high-k dielectric layer disposed on the nitride layer. The third gate structure includes an interfacial layer and a high-k dielectric layer disposed on the interfacial layer. In an embodiment, a metal gate electrode is formed on the high-k dielectric layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate;
   a first gate structure of an input/output (I/O) device formed on the semiconductor substrate, wherein the first gate structure includes a first oxide layer, a nitride layer on the first oxide layer, and a high-k dielectric layer on the nitride layer;

a second gate structure of a low-power device formed on the semiconductor device, wherein the second gate structure includes a second oxide layer, the nitride layer on the second oxide layer, and the high-k dielectric layer disposed directly on the nitride layer, wherein the first oxide layer is thicker than the second oxide layer;

a third gate structure formed on the semiconductor substrate, wherein the third gate structure includes an interfacial layer and the high-k dielectric layer disposed on the interfacial layer, wherein the first oxide layer is thicker than the interfacial layer; and a first isolation structure disposed in the semiconductor substrate and interposing the first and second gate structures and a second isolation structure disposed in the semiconductor substrate and interposing the second and third gate structures.

2. The semiconductor device of claim 1, further comprising:
a work function layer formed on the high-k dielectric layer of each of the first, second and third gate structures.

3. The semiconductor device of claim 1, wherein the interfacial layer includes a first high-k dielectric material and the high-k dielectric layer includes a second high-k dielectric material, the first and second high-k dielectric materials being different.

4. The semiconductor device of claim 1, wherein in the nitride layer is silicon nitride.

5. The semiconductor device of claim 1, wherein the first oxide layer is greater in thickness than the second oxide layer.

6. A semiconductor device, comprising:
a semiconductor substrate having first, second and third device regions;
a first gate structure in the first region, wherein the first gate structure includes a first dielectric layer, a hard mask layer formed on the first dielectric layer, and a high-k dielectric layer formed on the hard mask layer;
a second gate structure in the second region, wherein the second gate structure includes a second dielectric layer, the hard mask layer formed on the second dielectric layer, and the high-k dielectric layer formed on the hard mask layer, wherein the first dielectric layer is thicker than the second dielectric layer, wherein the hard mask layer is a metal nitride;
a third gate structure in the third region, wherein the third gate structure includes a third dielectric layer and the high-k dielectric layer formed on the third dielectric layer, wherein the third dielectric layer is different in composition than the second dielectric layer, and isolation structures in the semiconductor substrate and interposing each of the first region, the second region, and the third region.

7. The device of claim 6, wherein the first region is an input/output (I/O) region of the semiconductor substrate including I/O devices.

8. The device of claim 6, wherein the second region is a low-power region of the semiconductor substrate including low-power devices, wherein the second gate structure is associated with a low-power device in the low-power region.

9. The device of claim 6, wherein the hard mask layer is silicon nitride.

10. The device of claim 6, wherein the hard mask layer is formed directly on the first dielectric layer of the first gate structure and directly on the second dielectric layer of the second gate structure.

11. The device of claim 6, wherein the high-k dielectric layer is formed directly on the hard mask layer of the first gate structure and the second gate structure.

12. The device of claim 6, wherein each of the first, second and third gate structures further include at least one work function layer.

13. A device, comprising:
a first gate structure of an input/output transistor on a substrate and including a first dielectric layer, a silicon nitride layer on the first dielectric layer, a high-k dielectric layer on the silicon nitride layer, and a work function layer on the high-k dielectric layer;

a second gate structure of a low power transistor on the substrate and including a second dielectric layer, the silicon nitride layer on the second dielectric layer, the high-k dielectric layer disposed directly on the silicon nitride layer, and the work function layer on the high-k dielectric layer, wherein the second dielectric layer has a thickness less than the first dielectric layer;

a third gate structure of one of a PMOS and an NMOS transistor, the third gate structure including a third dielectric layer, the high-k dielectric layer disposed on the third dielectric layer, and the work function layer on the high-k dielectric layer and wherein the high-k dielectric layer extends to a top surface of each of the first, second and third gate structures; and a first shallow trench isolation feature between the first and second gate structures and a second shallow trench isolation feature between the second and third gate structures;

wherein the first and second gate structures are electrically coupled.

* * * * *